(12) United States Patent
Kirrmann et al.

(10) Patent No.: US 8,265,908 B2
(45) Date of Patent: Sep. 11, 2012

(54) SYSTEM LEVEL TESTING FOR SUBSTATION AUTOMATION SYSTEMS

(75) Inventors: Hubert Kirrmann, Daettwil (CH); Michael Obrist, Baden (CH); Wolfgang Wimmer, Rietheim (CH)

(73) Assignee: ABB Research Ltd, Zurich (CH)

( * ) Notice: Subject to any disclaimer, the term of this patent is extended or adjusted under 35 U.S.C. 154(b) by 0 days.

(21) Appl. No.: 12/766,278

(22) Filed: Apr. 23, 2010

(65) Prior Publication Data

US 2010/0204948 A1  Aug. 12, 2010

Related U.S. Application Data

(63) Continuation of application No. PCT/EP2008/064016, filed on Oct. 17, 2008.

(60) Provisional application No. 60/996,036, filed on Oct. 25, 2007.

(30) Foreign Application Priority Data

Feb. 11, 2008 (EP) .................................. 08151245

(51) Int. Cl.
*G06F 11/30* (2006.01)
*G06F 17/40* (2006.01)
*G06F 19/00* (2011.01)

(52) U.S. Cl. ...... 702/188; 73/865.8; 73/866.3; 340/635; 340/644; 702/1; 702/127

(58) Field of Classification Search ................ 73/432.1, 73/865.8, 865.9, 866.3; 307/43, 85, 86; 324/500, 324/509, 510, 511; 340/500, 540, 635, 639, 340/644, 646, 650, 652; 361/1, 35, 61, 62; 700/1, 28, 32, 33, 90, 286, 292, 293, 294, 700/295; 702/1, 57, 58, 60, 64, 65, 127, 702/182, 187, 188, 189
See application file for complete search history.

(56) References Cited

U.S. PATENT DOCUMENTS 2,883,255 A * 4/1959 Anderson ....................... 346/34
(Continued)

FOREIGN PATENT DOCUMENTS

DE  38 12 072 A1  10/1989
(Continued)

OTHER PUBLICATIONS

International Search Report issued in PCT/EP2008/064510 dated Jan. 27, 2009.
(Continued)

*Primary Examiner* — Edward Cosimano
(74) *Attorney, Agent, or Firm* — Buchanan Ingersoll & Rooney PC

(57) ABSTRACT

Protection, measurement and control IEDs in a substation compute if switches they control may be operated safely, according to interlocking rules or physical principles as well as the dynamic topology of the substation. The IEDs have access to the substation electrical topology, to real-time information generated by other IEDs, and to the rules for interlocking. A standardized Substation Configuration Description (SCD) of the substation for which a Substation Automation system is intended, and a standardized description of the implemented device functions or capabilities of an individual IED are utilized. The substation topology is available from SCD file, real time information about the position of switches and line voltage/current can be obtained via an appropriate protocol, and the interlocking rules are available in script form. These features apply both to simulated and real devices, and increase system testing possibilities by supporting an efficient configuration of a simulation.

16 Claims, 3 Drawing Sheets

U.S. PATENT DOCUMENTS

| | | | |
|---|---|---|---|
| 4,767,941 A | | 8/1988 | Brand et al. |
| 7,856,327 B2* | | 12/2010 | Schweitzer et al. ............ 702/60 |
| 8,112,235 B2* | | 2/2012 | Schweitzer et al. ............ 702/60 |
| 8,165,841 B2* | | 4/2012 | Vetter et al. .................. 702/122 |
| 2002/0059477 A1 | | 5/2002 | Wimmer et al. |
| 2002/0173927 A1 | | 11/2002 | Vandiver |
| 2008/0244044 A1 | | 10/2008 | Wimmer |
| 2009/0070062 A1 | | 3/2009 | Kirrmann et al. |
| 2009/0076762 A1* | | 3/2009 | Vetter et al. .................. 702/122 |
| 2009/0083019 A1* | | 3/2009 | Nasle ............................. 703/18 |
| 2009/0125158 A1* | | 5/2009 | Schweitzer et al. .......... 700/293 |
| 2011/0004425 A1* | | 1/2011 | Schweitzer et al. ............ 702/60 |

FOREIGN PATENT DOCUMENTS

| | | |
|---|---|---|
| DE | 195 41 147 C1 | 6/1997 |
| EP | 1 850 142 A1 | 10/2007 |
| EP | 1976177 A1 | 10/2008 |
| WO | WO 2009/053309 A1 * | 4/2009 |

OTHER PUBLICATIONS

Written Opinion issued in PCT/EP2008/064510 dated Jan. 27, 2009.

Crispino et al., An experiment using an Object-oriented standard—IEC 61850 to integrate IEDs Systems in Substations, Transmission & Distribution Conference & Exposition: Latin America, 2004, pp. 22-27.

Nguyen-Dinh et al., A Study on GOOSE Communication based on IEC 61850 using MMS Ease Lite, International Conference on Control, Automation and Systems 2007, Seoul, Korea, pp. 1873-1877.

International Search Report for PCT/EP2008/064016 completed Jan. 20, 2009.

Written Opinion for PCT/EP2008/064016 completed Jan. 20, 2009.

International Preliminary Report on Patentability for PCT/EP2008/064016 completed Feb. 5, 2010.

European Search Report for 08151245.1 dated Jul. 11, 2008.

Mohindar S. Sachdev, et al., A Computer-Aided Technique for Generating Substation Interlocking Schemes, IEEE Transactions on Power Delivery vol. 15, No. 2, Apr. 2000 pp. 538-544.

Bin Duan et al., Study on Substation Control Interlocking Combined with PKI/PMI Based Access Scurity Method, International Conference on Power System Tecyhnology, 2006, pp. 1-6.

* cited by examiner

SYSTEM LEVEL TESTING FOR SUBSTATION AUTOMATION SYSTEMS

RELATED APPLICATION

This application is a continuation application under 35 U.S.C. §120 of PCT/EP2008/064016 filed as an International Application on Oct. 17, 2008 designating the U.S., which claims the benefit under 35 U.S.C. §119 of expired U.S. Provisional Patent No. 60/996,036 filed on Oct. 25, 2007, the entire contents of which are hereby incorporated by reference in their entireties.

FIELD

The present disclosure relates to the field of Substation Automation (SA) systems for substations in high and medium voltage power networks. More particularly, the present disclosure relates to the implementation and testing of interlocking functionality in an Intelligent Electronic Device (IED) of an SA system.

BACKGROUND INFORMATION

An electric power system comprises a power transmission and/or distribution network interconnecting geographically separated regions, and a plurality of substations at the nodes of the power network. The substations include equipment for transforming voltages and for switching connections between individual lines of the power network. Power generation and load flow to consumers is managed by a central Energy Management System (EMS) and/or supervised by a Supervisory Control And Data Acquisition (SCADA) system located at a Network Control Centre (NCC).

Substations in high and medium voltage power networks include primary devices such as electrical cables, lines, bus bars, power transformers, instrument transformers as well as switching devices (circuit breakers or disconnectors) interconnecting bus-bars and/or bays (feeders). These primary devices are operated in an automated way via a SA system that is responsible for various substation-specific tasks such as controlling, protecting, measuring and monitoring. The SA system comprises secondary or process devices, also known as digital relays, which are interconnected in a SA communication network, and interact with the primary devices via a process interface. The secondary devices are generally assigned to one of three hierarchical levels, which are (a) the station level including an Operator Work Station (OWS) with a Human-Machine Interface (HMI) as well as the gateway to the Network Control Centre (NCC), (b) the bay level with its devices for protection, control and measurement, and (c) the process level comprising, for example, electronic sensors for voltage, current and gas density measurements as well as contact probes or position indicators for sensing switching device states and transformer tap changer positions, and actuators controlling the drive of a switching device or tap changer. At the process level, intelligent actuators may be integrated in the respective primary devices and connected to a bay unit via a serial link or an optical process bus. The bay units are connected to each other and to the devices on the station level via an inter-bay or station bus.

In more detail, a Protection, Control and Measurement (PCM) secondary device, which is also known as an IED in the IEC 61850 standard, controls a particular switching device, and operates on the base of signals from attached sensors for switch position, temperature, voltage, current, etc., signals from other IEDs indicating the state of their controlled elements, and signals from the supervisory system. Conversely, an IED generates signals to act on its switching elements, to communicate its state to other IEDs or to inform the supervisory system. These signals are either hard-wired or transmitted as network messages, for instance according to IEC 61850-8 or IEC 61850-9-2 messages.

In its protection function, a PCM IED monitors the state of a substation or of a part of the substation and autonomously opens an assigned circuit breaker in case the PCM IED detects a potentially dangerous situation such as an overload. In its control function, the PCM IED executes commands from the supervisory level, such as opening and closing assigned switching elements.

In a "select before operate" sequence, an operator may reserve a switching device for operation and command the PCM IED, by way of a switching request, to execute a particular close or open operation on a particular switch. The assigned PCM IED may then accept or refuse such a command depending on the electrical state of the attached lines in order to prevent a hazardous or damaging operation, such as connecting a live bus bar to earth. This safety mechanism is called interlocking.

Conventionally, the logic implementing the interlocking is programmed as Boolean expressions in tabular, code or function chart language on each PCM IED individually during the engineering phase of a substation project, which requires both time and considerable experience as well as a perfect knowledge of the substation topology. Parts of the interlocking logic are "compiled" and comprised in the function chart type logic on the PCM IEDs. This engineering process is normally done on the base of a fixed substation topology, and requires substantial changes in case, for instance, of an extension of an existing substation.

Any custom-made SA system is required to undergo system verification and validation. The supplier of the SA system is expected to demonstrate to a customer the correct coordinated operation of all parts in all possible scenarios, as well as the expected quality or performance such as throughput and timely response also under high load. As the operation of a particular PCM IED also depends on signals that are generated by other PCM IEDs, such signals have to be properly prepared in order to reproduce all expected states of the substation. A large range of tests allowing manipulation of the signals generated by other IEDs have thus been devised. These tests are hereafter called system level tests such as System Integration Tests or System Verification Tests (Factory Acceptance Test (FAT), and a Site Acceptance test (SAT)).

The aforementioned system level tests are generally performed in a test environment or test rig, in which a number of IEDs are installed. However, due to the sheer number of IEDs necessitating an increasingly complicated test rig, and due to cost and space limitations, not all the IEDs of a particular substation are installed for a FAT. Accordingly, the extent and coverage of the test configurations is limited, and in particular, interlocking functionality as detailed above is only partially testable in the factory. The tested IEDs represent only a typical part of the substations and are only given access to a minimum number of signals necessary as input to their respective interlocking logic.

According to U.S. Pat. No. 4,767,941, the implementation of interlocking functionality can be automated provided that the IED knows the actual topology of the substation, i.e. the actual switching states of all switching devices, and an exhaustive set of rules for interlocking operation. Decoupling the topological configuration of the substation from the interlocking rules allows each of them to be updated independently and thus increases flexibility. The signals that indicate the switching state of the associated switching devices are supplied via dedicated data buses and data links to a centralized data acquisition and processing unit. By evaluating the signals, the actual topology of the substation is inferred, and based on the interlocking rules, a release pattern is determined and stored. The latter indicates a release or blocking property for each switching device, i.e. if a specific switching operation request command is to be accepted or refused.

SUMMARY

An exemplary embodiment provides a method of testing an interlocking functionality of a first Intelligent Electronic Device (IED) connected to a communication network and adapted to control a first switching device of a substation of an electric power system. The exemplary method comprises preparing, by the first IED, an interlocking response indicating at least one of a release and blocking property of the first switching device. The exemplary method also comprises determining, by a testing device different from the first IED, an interlocking status indicating at least one of a release and blocking property of the first switching device. In addition, the exemplary method comprises determining, in the testing device, a dynamic substation topology that is representative of at least a part of the substation and inferred from a standardized description of a static substation topology and from a dynamic switch status of a second switching device of the substation. In accordance with the exemplary method, the testing device determines the interlocking status based on the determined dynamic substation topology and interlocking rules.

An exemplary embodiment provides a test environment comprising a first Intelligent Electronic Device (IED) connected to a communication network and adapted to control a first switching device of a substation of an electric power system. The exemplary test environment also comprises a testing device connected to the first IED via the communication network. The first IED is configured to prepare an interlocking response indicating at least one of a release and blocking property of the first switching device. The testing device is configured to determine a dynamic substation topology that is representative of at least a part of the substation and inferred from a standardized description of a static substation topology and from a dynamic switch status of a second switching device of the substation. The testing device is also configured to determine an interlocking status indicating at least one of a release and blocking property of the first switching device, based on the determined dynamic substation topology and interlocking rules.

An exemplary embodiment provides a computer-readable recording medium having a computer program recorded thereon that causes a processor of a testing device to test an interlocking functionality of a first Intelligent Electronic Device (IED) connected to a communication network and adapted to control a first switching device of a substation of an electric power system. The program causes the processor of the testing device to execute operations comprising: receiving an interlocking response prepared by the first IED, the interlocking response indicating at least one of a release and blocking property of the first switching device; determining an interlocking status indicating at least one of a release and blocking property of the first switching device; and determining a dynamic substation topology that is representative of at least a part of the substation and inferred from a standardized description of a static substation topology and from a dynamic switch status of a second switching device of the substation. The processor of the testing device determines the interlocking status based on the determined dynamic substation topology and interlocking rules.

BRIEF DESCRIPTION OF THE DRAWINGS

Additional refinements, advantages and features of the present disclosure are described in more detail below with reference to exemplary embodiments illustrated in the drawings, in which.

The reference symbols used in the drawings, and their meanings, are listed in summary form in the list of reference symbols. In principle, identical parts are provided with the same reference symbols in the figures.

DETAILED DESCRIPTION

Exemplary embodiments of the present disclosure facilitate and extend system level testing of interlocking functionality for Substation Automation (SA) systems. An exemplary embodiment provides a method of testing interlocking functionality of an Intelligent Electronic Device (IED). Another exemplary embodiment provides an IED of an SA system, where the IED is configured to facilitate and extend system level testing of the interlocking functionality of the SA system.

Figure 3:
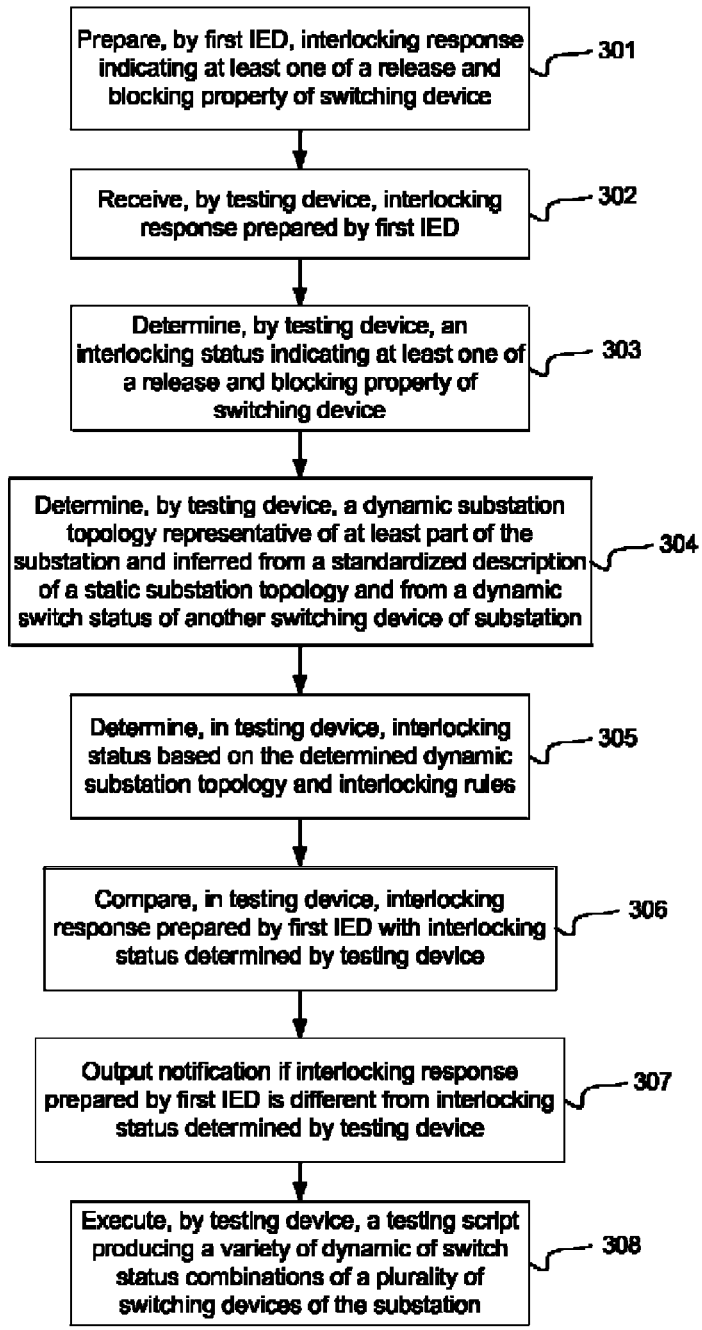
FIGS. 3-5 show operative features of elements of the present disclosure.

According an exemplary embodiment of the present disclosure, as illustrated in FIG. 3, a first IED implementing interlocking functionality to be tested, also termed a Device Under Test (DUT), prepares an interlocking response indicating a release or blocking property (301). For example, the first IED can prepare an interlocking responding indicating whether or not the first IED intends to open or close a first switching device that is assigned to and controlled by the first IED. At the same time, a testing device, which may be an industrial computer having a processor with appropriate processing power that is configured to execute a computer-readable program recorded on a computer-readable medium (e.g., non-volatile memory such as a ROM, hard disk drive, flash memory, etc.), and which may itself be considered an IED in the sense given above, receives the interlocking response prepared by the first IED (302), and independently determines an interlocking status for the first switching device (303). The interlocking status determined by the testing device is then compared to the interlocking response prepared by the first IED (306). In case of discrepancy between the two, the existence of an error is concluded and reported (307). In order to facilitate and render this testing process more flexible, the testing device is provided with information about a dynamic or present topology of a part of a substation comprising a neighborhood of the first switching device. This information, in conjunction with a set of pre-established, generalized interlocking rules, enables the testing device to perform interlocking decisions on behalf of the first, or any other, switching device, and requires considerably less configuration efforts as compared to a programming, at the testing device, of function chart type logic for each of the respective switching devices. In other words, the interlocking functionality or logic of the first or any further real IED(s) to be tested is simulated or emulated by the testing device in a scalable manner, where the benefit of which increases with the number of IEDs to be tested.

In accordance with an exemplary embodiment of the present disclosure as illustrated in FIG. 3, the testing device can be configured to store information in digital form about a static substation topology, and generate information required for obtaining the relevant dynamic state of the substation from the static substation topology. Hence, in a first processing operation, the testing device is given a static topology or structure of the substation in a standardized description or format, such as, for instance, the substation section of a Substation Configuration Description (SCD) file according to the substation communication standard IEC 61850, indicating, for example, the role of the first IED in the substation. In a second processing operation, during the actual testing, information about a status of at least one further switching device in the substation other than the first switching device assigned to the first IED is exploited. Likewise, part of the SCD file includes information about a Configured IED Description (CID), i.e. a standardized description of implemented device functions of the first IED to be simulated. This CID information is advantageously used by the testing device in order to properly assign or link data from the first IED to various primary devices of the substation (see (304) and (305) in FIG. 3).

Figure 4:
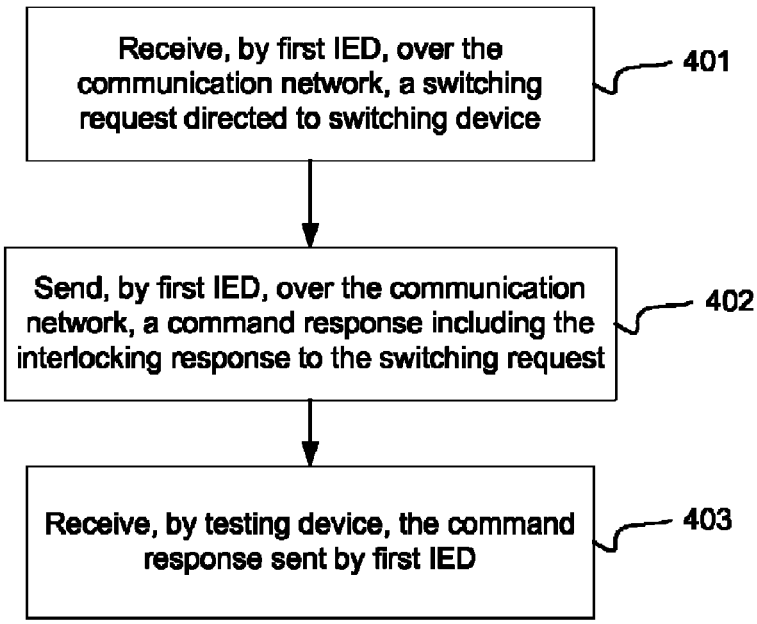

In an exemplary embodiment of the disclosure as illustrated in FIG. 4, the first IED receives a switching request directed to the first switching device (401), and responds with a command response message comprising an interlocking response (402). The command respond message is transmitted to, received and evaluated by the testing device (403). In other words, the testing device is responsible for both the simulation of the interlocking behaviour of the IEDs under test as well as for the subsequent comparison of their interlocking response and the interlocking status. At the same time, the SA communication network, i.e. the correct addressing and exchange of network messages, can be tested as well. As any change of a switch state at one IED also influences the interlocking state at further IEDs, even if assigned to other bays, the testing device may, by means of the command response messages from the first as well as further real IEDs, obtain and compare with its own simulation a coherent and time-resolved interlocking response of the entire substation.

Figure 5:
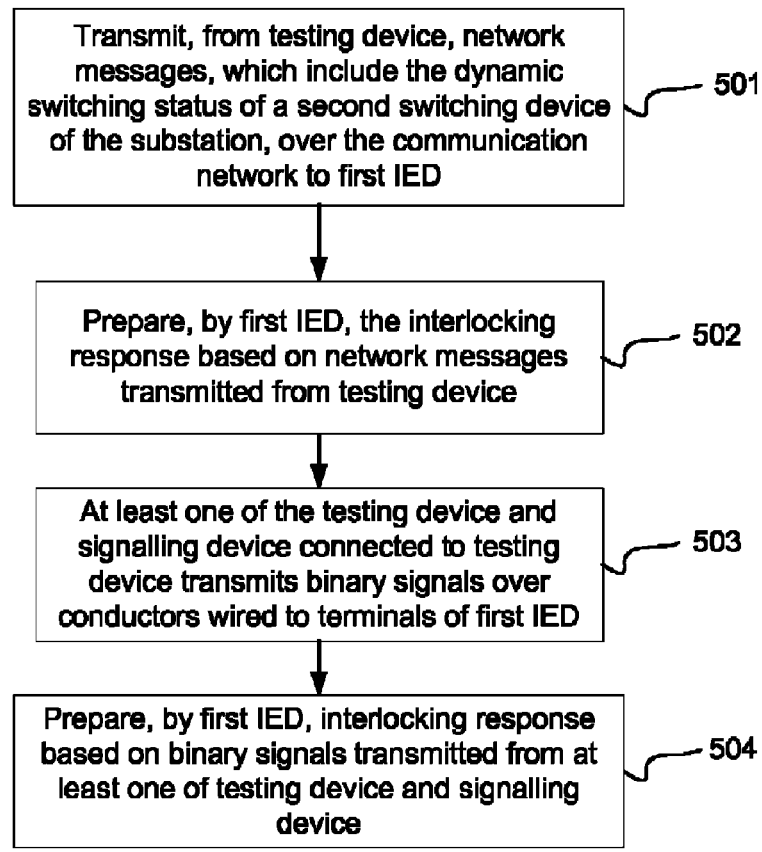

In an exemplary embodiment of the present disclosure, the testing device prepares the information about the status of at least one further switching device in the substation on behalf of the first IED by means of suitable network messages and/or binary signals (see (501) in FIG. 5). The network messages are transmitted over an SA communication network to the first IED, and may be, for example, Generic Object Oriented Substation Events (GOOSE). On the other hand, binary-type copper signals are generated by the testing device itself, or a dedicated signalling device connected to the testing device, and transmitted via dedicated copper cables that are hard-wired to the first IED. In a real SA system, such copper signals report the state of the further switching devices that are directly wired to terminals of the first IED, and may even originate from a bay other than the one comprising the first switching device. In order to correctly generate and transmit the binary signals, the testing device has to be aware of the logical signal name allocated to the binary signals at the terminals of the first IED, and this information may be provided to the testing device by means of the private wiring section for non-IEC 61850 signals of the Substation Configuration Description (SCD) file mentioned above (see (308) in FIG. 3). By way of example, CBR.2.X.101/X.102 indicates that terminal 101 and 102 receive the double indication status of switching device CBR.2. The copper based binary signals may also carry other information, such as a sufficient $SF_6$ pressure in the first switching device. The first testing device may generate the signals corresponding to a plurality of further IEDs, and emulate an entire bay of the substation or even the whole substation.

Aspects of the above-described exemplary embodiments are not only applicable to simulated IEDs emulated by or embedded in a testing device, but to real process devices or dedicated Protection, Control and Measurement (PCM) IEDs providing or implementing interlocking functionality for a switching device in a substation of an electric power system. Hence, a real IED is provided with and stores, in digital form, in a memory thereof, information about a static substation topology as well as an exhaustive set of interlocking rules that enables the IED to perform interlocking safety. In a first processing operation, for example, as part of an engineering process, the IED is provided with a static topology or structure of the substation in standardized description or format, indicating its own role in the substation. In a second processing operation, during testing or regular operation of the SA system, for example, messages indicative of a status of at least one further switching device in the substation are generated by a second IED of the SA system and transmitted over a SA communication network to the IED. For example, in terms of the substation communication standard IEC 61850, the standardized description is a Substation Configuration Description (SCD) file, while the network messages are Generic Object Oriented Substation Events (GOOSE). Since the SCD file may be large, an extraction or excerpt from the SCD file comprising all information needed for topology-based interlocking can be communicated in a compressed form to the IED. During operation, the IED evaluates the static topology and the actual switch states to produce a dynamic topology of the substation, based on which, together with the interlocking rules, a switching request from the supervisory level (operator, remote control or local human interface) received via MMS with Select/Operate service is processed and accepted or denied.

According to an exemplary embodiment, the IED is wired, via its binary I/O terminals, to a conductor or process bus connection, via which the IED receives binary signals indicative of switching status. In this exemplary arrangement, the IED can be provided with information about these binary signals required for obtaining the relevant dynamic state of the substation from the static substation topology, and in particular the assignment of the terminals as, for example, comprised in the private wiring section for non-IEC 61850 signals of the Substation Configuration Description (SCD) file.

Implementation as well as a later adaptation, e.g. to a changed static topology, of the interlocking functionality of Intelligent Electronic Devices (IEDs) of a SA system is considerably simplified by the above aspects of the present disclosure. Furthermore, the preparations for processing a switching request directed to the switching device assigned to the IED are advantageously carried out upfront, generating suitable release patterns to be consulted upon reception of a switching request, and to be cyclically refreshed at suitable intervals of, for example, 5-10 ms corresponding to the reception of the most actual switching state information from the neighboring IEDs.

A real IED comprising a "topology engine" as described above may likewise be the object of an interlocking test as described previously. In this case, the outcome of the IED and the testing device would be identical, so any discrepancy between interlocking response and status has to be due to an incorrect "cabling". The latter may include addressing errors when configuring GOOSE messages, or erroneous wirings for the binary signals.

In accordance with an exemplary embodiment, the present disclosure proposes that protection, measurement and control IEDs in a substation compute, according to interlocking rules or physical principles as well as knowledge of the dynamic topology of the substation, for every switch the IEDs respectively control if that switch may be operated safely, in contrast to a conventional and separate programming of the interlocking logic for each IED. In this respect, the IEDs have access to the substation electrical topology, to the real-time information generated by other IEDs, and to the rules for interlocking (see (502) and (504) in FIG. 5). Exemplary embodiments of the present disclosure take advantage of a standardized Substation Configuration Description (SCD) of the substation for which the SA system is intended, as well as of a standardized description of the implemented device functions or capabilities of an individual IED. For example, the substation topology can be made available from the substation configuration description (SCD file in IEC 61850 format) and the real time information about the position of switches and line voltage/current can be read over the IEC 61850 protocol, for example, while the interlocking rules are available in script form as disclosed in U.S. Pat. No. 4,767,941, as expert system rules, or in any other suitably coded form. This concept applies both to simulated and real devices, and greatly increases system testing possibilities by supporting an efficient configuration of a simulation.

Exemplary embodiments of the present disclosure also provide a computer-readable recording medium (e.g., non-volatile memory) having a computer program recorded thereon that causes a computer of a testing device to control one or more processors of the testing device connected to the communication network of a SA system to test an interlocking functionality of a first Intelligent Electronic Device (IED), which is adapted to control a first switching device of a substation of an electric power system. When executed by the computer, the computer program causes the testing device to execute an operation of determining, based on a dynamic substation topology representative of at least a part of the substation as well as based on interlocking rules, an interlocking status indicating a release or blocking property of the first switching device, and an operation of comparing the interlocking status with an interlocking response prepared by the first IED.

Figure 1:
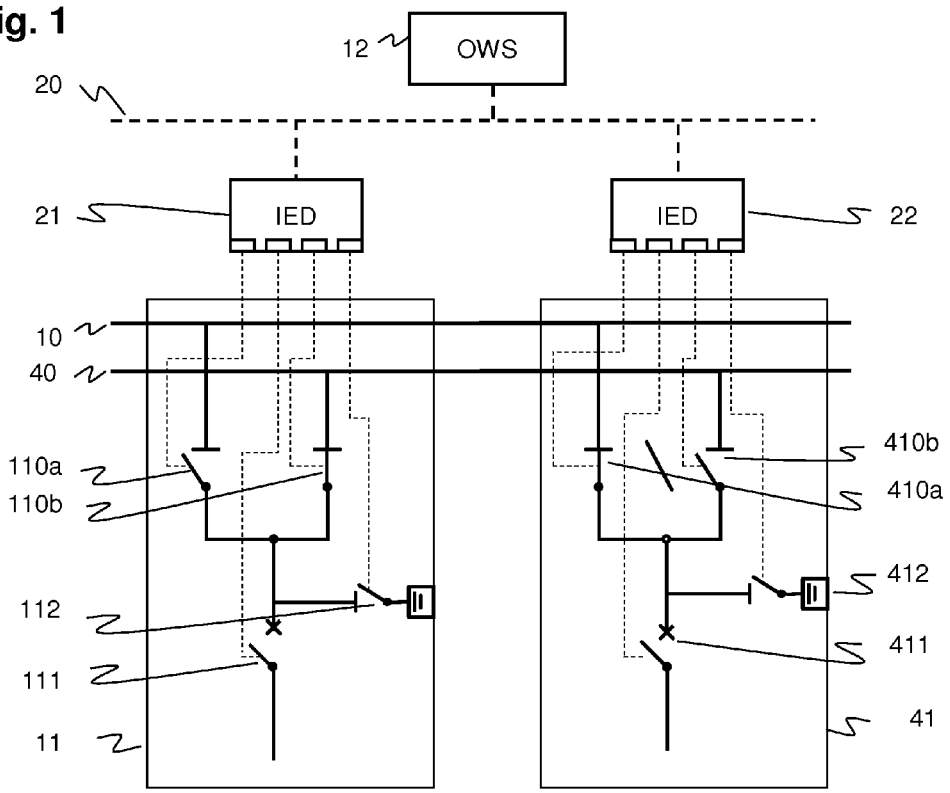
FIG. 1 shows an excerpt of a single line diagram of a substation according to an exemplary embodiment, FIG. 2 schematically shows an exemplary testing environment according to at least one embodiment of the present disclosure.

FIG. 1 shows a single line diagram of a part or section of an exemplary substation at an assumed voltage level of 110 kV, for example, as well as an exemplary SA system and/or secondary equipment. The model of a switch yard at the single line level contains a topological representation of various electrical connections between primary equipment. The substation comprises a double bus bar configuration with two bus bars 10, 40, which feed two bays 11, 41 via disconnectors 110*a*, 110*b* and 410*a*, 410*b*, respectively. Each bay 11, 41 comprises a circuit breaker 111, 411 and an earthing switch 112, 412, respectively. As illustrated in the example of FIG. 1, the corresponding excerpt of the SA system depicts, in broken lines, a communication network 20 and two IEDs 21, 22, which both host logical nodes of class CSWI (switch control). Each logical node is allocated to one of the aforementioned switching devices 110*a*, 110*b*, 111, 112, 410*a*, 410*b*, 411 and 412 as indicated by the thin broken lines in FIG. 1. An Operator Work Station 12 is also depicted.

A simple aspect of interlocking prevents the disconnectors 110 and circuit breaker 111 to close as long as earthing switch 112 connects the attached lines to ground. Hence, in order to prevent a hazardous or damaging operation, such as connecting a live bus bar to earth, a corresponding command would be refused. Likewise, disconnector 110*a* is not to be opened while disconnector 110*b* is being closed, i.e. interaction between two switching processes is to be avoided.

Figure 2:
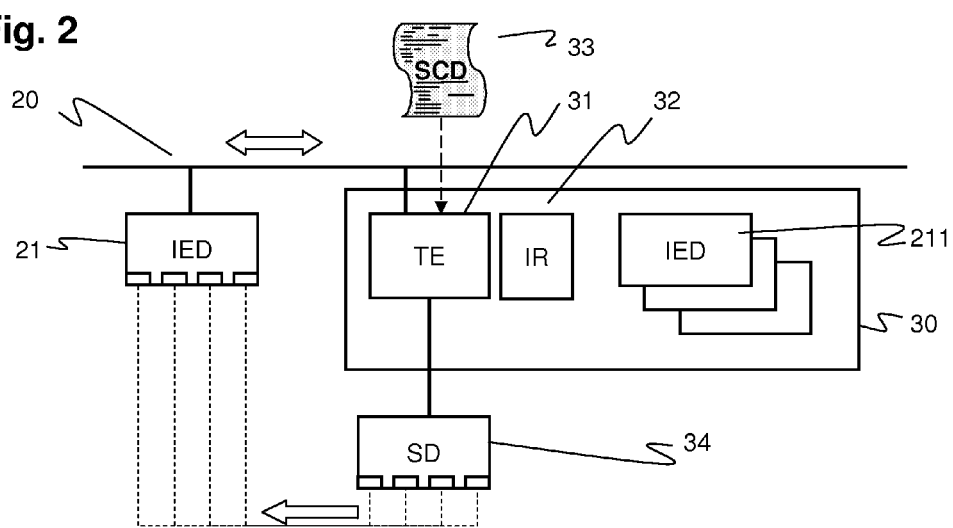

FIG. 2 shows an exemplary test environment or test set-up according to the present disclosure together with a first IED 21 under test. The first IED 1 is connected to the SA communication network 20. In the exemplary embodiment of FIG. 2, a testing device 30 is also connected to the SA communication network 20. The testing device 30 includes dedicated processing means for simulating or emulating the IED 21 under test (indicated by simulated IED 211). According to an exemplary embodiment, the processing means of the testing device 30 may include a computer having a processor configured to execute a computer-readable program and/or computer-readable instructions recorded on a computer-readable medium (e.g., non-volatile memory, such as a ROM, hard disk drive, flash memory, etc.) The testing device can 30 also simulate additional IEDs that may or may not be physically present in the test environment.

The testing device 30 includes a Topology Engine (TE) module 31 for inferring a dynamic substation topology and a memory (e.g., non-volatile memory) for storing Interlocking Rules (IR) 32. The TE module 31 is provided with at least an excerpt of the SCD file 33 of the substation includes the static substation topology, and creates a dynamic topology based on the SCD file 33. In accordance with the SCD file 33, the TE module 31 is configured to generate and transmit network messages over the SA communication network 20 to the first IED 21 under test. The testing device 31 is configured to monitor and evaluate a response of the IED 21 under test to the transmitted network messages to determine whether or not the IED 21 operates as expected.

A signaling device (SD) 34 or remote controlled signal generator is shown external to and in communication with the testing device 30, wherein the signaling device 34 or remote controlled signal generator may also be a part or a module of the testing device 30. The TE module 31 generates binary signals representing sensors or switch status information, and these simulated process signals are applied, via dedicated copper wires, to binary input terminals of the IED 21 under test via the signaling device 34 or remote controlled signal generator (see (503) in FIG. 5).

It will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

LIST OF DESIGNATIONS

10, 40 bus bar
11, 41 bay
110*a*, 110*b*, 410*a*, 410*b* disconnector
111, 411 circuit breaker
112, 412 earthing switch
20 SA communication network
21, 211 first Intelligent Electronic Device (IED)
22 second IED
12 operator work station (OWS)
30 testing device 31 topology module
32 interlocking rules
33 SCD file
34 signaling device (SD)

What is claimed is:

1. A method of testing an interlocking functionality of a first Intelligent Electronic Device (IED) connected to a communication network and adapted to control a first switching device of a substation of an electric power system, the method comprising:
preparing, by the first IED, an interlocking response indicating at least one of a release and blocking property of the first switching device;
determining, by a testing device different from the first IED, an interlocking status indicating at least one of a release and blocking property of the first switching device; and
determining, in the testing device, a dynamic substation topology that is representative of at least a part of the substation and inferred from a standardized description of a static substation topology and from a dynamic switch status of a second switching device of the substation,
wherein the testing device determines the interlocking status based on the determined dynamic substation topology and interlocking rules.

2. The method according to claim 1, comprising:
receiving over the communication network, by the first IED, a switching request directed to the first switching device;
sending over the communication network, by the first IED, a command response message comprising the interlocking response to the switching request; and
receiving, by the testing device, the command response message sent by the first IED.

3. The method according to claim 1, comprising:
comparing, in the testing device, the interlocking response prepared by the first IED with the interlocking status determined by the testing device; and
outputting notification if the interlocking response prepared by the first IED is different from the interlocking status determined by the testing device.

4. The method according to claim 1, comprising:
transmitting, from the testing device, network messages over the communication network to the first IED, the network messages including a dynamic switch status of the second switching device of the substation; and
preparing, by the first IED, the interlocking response based on the network messages transmitted form the testing device.

5. The method according to claim 4, comprising:
executing, by the testing device, a testing script producing a variety of dynamic switch status combinations of a plurality of switching devices of the substation.

6. The method according to claim 1, comprising:
transmitting, from at least one of the testing device and a signalling device connected to the testing device, binary signals over conductors wired to terminals of the first IED, the binary signals including a dynamic switch status of a second switching device of the substation; and
preparing, by the first IED, the interlocking response based on the binary signals transmitted from the at least one of the testing device and the signalling device.

7. The method according to claim 6, comprising:
executing, by the testing device, a testing script producing a variety of dynamic switch status combinations of a plurality of switching devices of the substation.

8. A test environment comprising:
a first Intelligent Electronic Device (IED) connected to a communication network and adapted to control a first switching device of a substation of an electric power system; and
a testing device connected to the first IED via the communication network, wherein:
the first IED is configured to prepare an interlocking response indicating at least one of a release and blocking property of the first switching device;
the testing device is configured to
determine a dynamic substation topology that is representative of at least a part of the substation and inferred from a standardized description of a static substation topology and from a dynamic switch status of a second switching device of the substation, and
determine an interlocking status indicating at least one of a release and blocking property of the first switching device, based on the determined dynamic substation topology and interlocking rules.

9. The test environment according to claim 8, wherein the testing device is configured to:
compare the interlocking response prepared by the first IED with the interlocking status determined by the testing device; and
output notification if the interlocking response prepared by the first IED is different from the interlocking status determined by the testing device.

10. The testing environment according to claim 8, wherein:
the first IED is configured to receive over the communication network a switching request directed to the first switching device, and send over the communication network a command response message comprising the interlocking response to the switching request; and
the testing device is configured to receive the command response message sent by the first IED.

11. The testing environment according to claim 8, wherein:
the testing device transmitting, from the testing device, network messages over the communication network to the first IED, the network messages including a dynamic switch status of the second switching device of the substation; and
preparing, by the first IED, the interlocking response based on the network messages transmitted form the testing device.

12. The testing environment according to claim 11, wherein the testing device is configured to execute a testing script producing a variety of dynamic switch status combinations of a plurality of switching devices of the substation.

13. The testing environment according to claim 8, wherein:
at least one of the testing device and a signalling device connected to the testing device is configured to transmit binary signals over conductors wired to terminals of the first IED, the binary signals including a dynamic switch status of a second switching device of the substation; and
the first IED is configured to prepare the interlocking response based on the binary signals transmitted from the at least one of the testing device and the signalling device.

14. The testing environment according to claim 13, wherein the testing device is configured to execute a testing script producing a variety of dynamic switch status combinations of a plurality of switching devices of the substation.

15. A computer-readable recording medium having a computer program recorded thereon that causes a processor of a testing device to test an interlocking functionality of a first Intelligent Electronic Device (IED) connected to a communication network and adapted to control a first switching device of a substation of an electric power system, the program causing the processor of the testing device to execute operations comprising:

receiving an interlocking response prepared by the first IED, the interlocking response indicating at least one of a release and blocking property of the first switching device;

determining an interlocking status indicating at least one of a release and blocking property of the first switching device; and determining a dynamic substation topology that is representative of at least a part of the substation and inferred from a standardized description of a static substation topology and from a dynamic switch status of a second switching device of the substation, wherein the processor of the testing device determines the interlocking status based on the determined dynamic substation topology and interlocking rules.

16. The computer-readable recording medium according to claim 15, wherein the program causes the processor of the testing device to execute operations comprising:

comparing the interlocking response prepared by the first IED with the determined interlocking status; and outputting notification if the interlocking response prepared by the first IED is different from the determined interlocking status.

\* \* \* \* \*